(12) United States Patent
McLachlan

(10) Patent No.: US 6,236,083 B1
(45) Date of Patent: May 22, 2001

(54) POWER DEVICE

(75) Inventor: Craig McLachlan, Valkaria, FL (US)

(73) Assignee: Intersil Corporation, Palm Bay, FL (US)

( * ) Notice: Subject to any disclaimer, the term of this patent is extended or adjusted under 35 U.S.C. 154(b) by 0 days.

(21) Appl. No.: 09/542,561

(22) Filed: Apr. 4, 2000

Related U.S. Application Data

(62) Division of application No. 09/330,437, filed on Jun. 11, 1999, now Pat. No. 6,078,077, which is a division of application No. 08/662,118, filed on Jun. 12, 1996, now Pat. No. 5,913,130.

(51) Int. Cl.[7] .......................... H01L 29/76; H01L 29/94; H01L 31/062
(52) U.S. Cl. ............................ 257/328; 257/329
(58) Field of Search ...................... 257/325, 329

(56) References Cited

U.S. PATENT DOCUMENTS

| 4,338,481 |   | 7/1982  | Mandelkorn . |
|-----------|---|---------|--------------|
| 4,729,007 | * | 3/1988  | Coe . |
| 4,946,716 |   | 8/1990  | Corrie . |
| 4,968,628 |   | 11/1990 | Delgado et al. . |
| 5,127,984 |   | 7/1992  | Hua et al. . |
| 5,208,471 |   | 5/1993  | Mori et al. . |
| 5,342,797 | * | 8/1994  | Sapp et al. . |
| 5,476,566 |   | 12/1995 | Cavasin . |
| 5,543,645 |   | 8/1996  | Barret et al. . |
| 5,612,562 |   | 3/1997  | Siaudeau et al. . |
| 5,670,392 | * | 9/1997  | Ferla et al. . |

FOREIGN PATENT DOCUMENTS

| 56-129698 | 10/1981 | (JP) . |
|-----------|---------|--------|
| 57-153438 | 9/1982  | (JP) . |
| 57-172721 | 10/1982 | (JP) . |
| 58-191422 | 11/1983 | (JP) . |
| 59-84474  | 5/1984  | (JP) . |
| 59-155917 | 9/1984  | (JP) . |
| 60-154524 | 8/1985  | (JP) . |
| 61-188975 | 8/1986  | (JP) . |
| 61-281561 | 12/1986 | (JP) . |
| 62-22441  | 1/1987  | (JP) . |
| 62-49628  | 3/1987  | (JP) . |
| 2-123093  | 6/1987  | (JP) . |
| 63-76485  | 4/1988  | (JP) . |
| 3-241825  | 10/1991 | (JP) . |
| 5-13780   | 1/1993  | (JP) . |
| 63-256599 | 10/1998 | (JP) . |

\* cited by examiner

*Primary Examiner*—Stephen D. Meier
(74) *Attorney, Agent, or Firm*—Jaeckle Fleischmann & Mugel, LLP

(57) ABSTRACT

A method for fabricating a field effect transistor using the supporting substrate as a device layer in accordance with the present invention comprises several steps. To fabricate the field effect transistor, an epitaxial layer is grown on one surface of a substrate having an opposing surface, the epitaxial layer forming a drain for the transistor. Once the epitaxial layer is grown, the substrate is thinned to an appropriate device thickness and then a gate and a source for the transistor are formed on the opposing surface of the substrate. In an alternative embodiment, a polysilicon layer is used instead of the epitaxial layer. A field effect transistor fabricated from the method described above includes an epitaxial layer formed on one surface of a substrate having an opposing surface, the epitaxial layer forming a drain for the transistor and a gate and a source for the transistor formed on the other surface of the substrate. Again, a polysilicon layer may be used instead of the epitaxial layer in the transistor.

7 Claims, 5 Drawing Sheets

POWER DEVICE

CROSS-REFERENCE TO RELATED APPLICATIONS

This application is a divisional application of U.S. patent application Ser. No. 09/330,437, filed Jun. 11, 1999 now U.S. Pat. No. 6,078,077 which is a divisional application of U.S. patent application Ser. No. 08/662,118 filed Jun. 12, 1996 now U.S. Pat. No. 5,913,130.

FIELD OF THE INVENTION

This invention relates generally to a method for fabricating power devices and more particularly to a method for fabricating a transistor using the supporting substrate as a device layer and apparatus thereof.

BACKGROUND OF THE INVENTION

A typical method for fabricating a field effect transistor is illustrated in FIGS. 1(a–b). As shown in FIGS. 1(a–b), a lightly doped—epitaxial layer with a thickness of about 180 $\mu$m is grown on a 600 $\mu$m N+ substrate Once the —epitaxial layer is grown, the field effect transistor is formed using the—epitaxial layer and the N+ substrate.

The problem with the method describe above is that the practical limit for the thickness of the epitaxial layer is about 200 $\mu$m thick and some recent power device applications need the epitaxial layer to be about 300 $\mu$m thick. The thickness of the epitaxial layer is limited because it is expensive to make thicker, it is difficult to manufacture, and when the epitaxial layer is made thicker it is more likely to have problems with material quality, such as stacking faults, non-uniformity of thickness, and non-uniformity of resistivity. Accordingly, the above-describe method is not useful for power device applications which need the epitaxial layer, which is being used as the "primary" device layer, to be about 300 $\mu$m thick.

One solution to this problem has been the use of silicon-on-silicon bonded waffers to provide a thicker device layer, i.e. about 300 $\mu$m thick, however the use of these bonded wafers poses other problems. Primarily, the problem with this solution is its cost because it requires the purchase of an additional substrate wafer which is expensive. Additionally, there are typically processing problems with forming the bonded interface between the silicon-on-silicon wafers which reduces the yield of useful bonded wafers. Accordingly, the silicon-on-silicon bonded wafers are not a satisfactory solution.

SUMMARY OF THE INVENTION

A method for fabricating a field effect transistor using the supporting substrate as a device layer in accordance with the present invention comprises several steps. To fabricate the field effect transistor, an epitaxial layer is grown on one surface of a substrate having an opposing surface, the epitaxial layer forming a drain for the transistor. Once the epitaxial layer is grown, the substrate is thinned to an appropriate device thickness and then a gate and a source for the transistor are formed on the opposing surface of the substrate. In an alternative embodiment, a polysilicon layer is used instead of the epitaxial layer. A field effect transistor fabricated from the method described above includes an epitaxial layer formed on one surface of a substrate having an opposing surface, the epitaxial layer forming a drain for the transistor and a gate and a source for the transistor formed on the other surface of the substrate. Again, a polysilicon layer may be used instead of the epitaxial layer in the transistor.

The method for fabricating a transistor using the supporting substrate as a device layer and apparatus thereof provides a number of advantages. The transistor benefits from the higher material quality of the substrate which does not have the same material quality problems that an epitaxial layer of the same thickness would have. Additionally, since the substrate is the "primary" device layer, factors such as the resistivity, uniformity of thickness, and stacking faults in the epitaxial layer are not as critical. Further, since the substrate is used to provide the thicker device layer, the epitaxial layer only needs to be grown to a thickness of about 150 to 180 $\mu$m and the polysilicon layer only needs to be grown to a thickness of about 200 to 300 $\mu$m where the above-noted problems with material quality are less likely to occur.

DETAILED DESCRIPTION OF THE INVENTION

A method for fabricating a field effect transistor 10 using the substrate 12 as a "primary" device layer in accordance with the present invention is illustrated in FIGS. 2(a–d). A field effect transistor 10 fabricated from the method includes an epitaxial layer 14 formed on one surface of the substrate 12 having an opposing surface, the epitaxial layer 14 forming a drain for the transistor 10 and a gate and a source for the transistor 10 formed on the other surface of the substrate 12. The transistor 10 made from this method benefits from the higher material quality of the substrate 12 which does not have the same material quality problems that an epitaxial layer of the same thickness would have. Additionally, since the substrate 10 is the "primary" device layer, factors such as the resistivity, uniformity of thickness, and stacking faults in the epitaxial layer are not as critical. Further, since the substrate 12 is used to provide the thicker device layer, the epitaxial layer 14 only needs to be grown to a thickness of about 150 to 180 $\mu$m where the above-noted problems with material quality are less likely to occur.

Referring to FIGS. 2(a–d), one method for making for fabricating a field effect transistor 10 using the N– substrate 12 as a device layer is illustrated. In this particular embodiment, the field effect transistor 10 is a vertical DMOS transistor although other types of transistors such as a bipolar transistor, could also be made. As shown in FIG. 2(a), first the N– substrate 12 is obtained. Preferably, a high quality monocrystalline silicon wafer is selected for use as the N– substrate 12. In this particular embodiment, the N– substrate 12 has a thickness of is about 600 $\mu$m and typically ranges between 500 to 700 $\mu$m, although the particular thickness can vary as needed and desired.

Figure 1A:
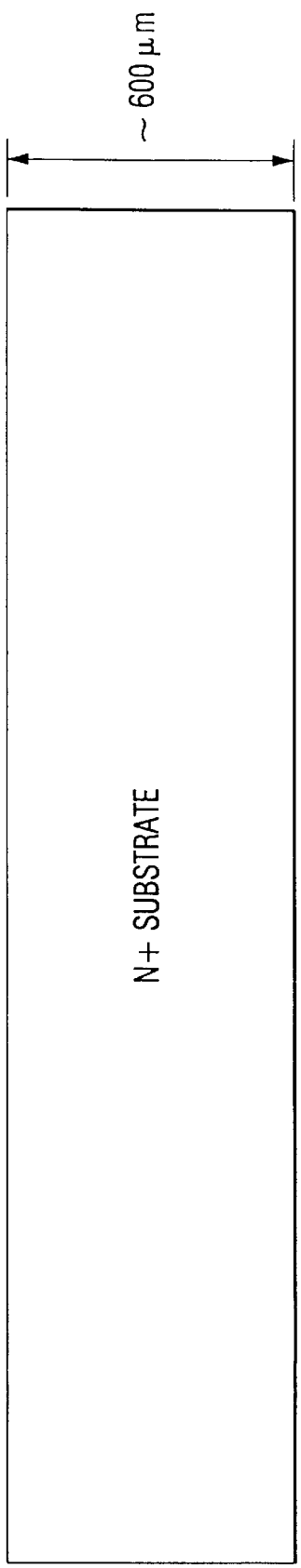
FIGS. 1(a–b) are cross-sectional views illustrating a prior art method for fabricating a transistor.
Figure 1B:
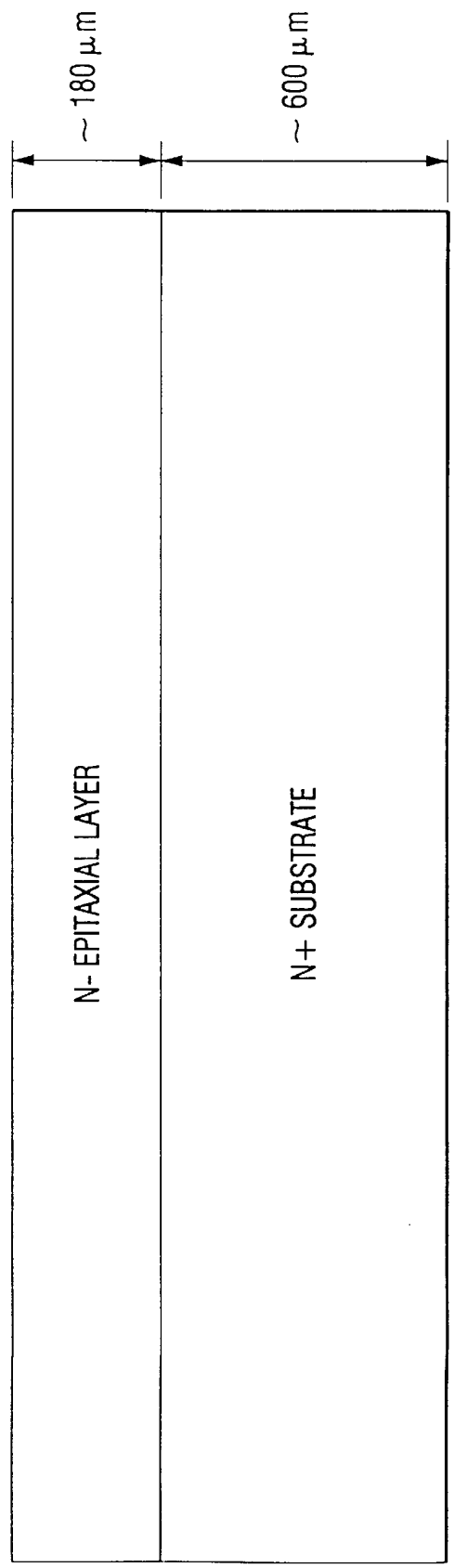
Figure 2A:
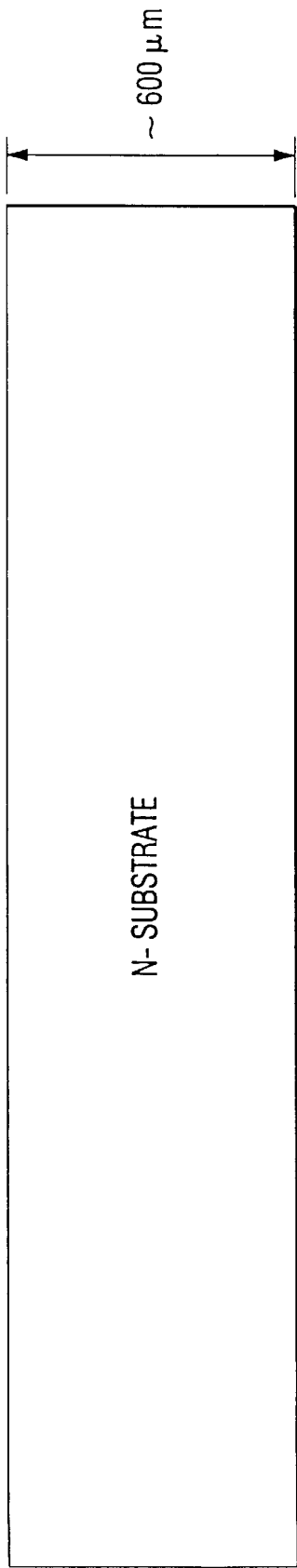
FIGS. 2(a–d) are cross-sectional views illustrating one method for fabricating a vertical power DMOS transistor in accordance with the present invention.
Figure 2B:
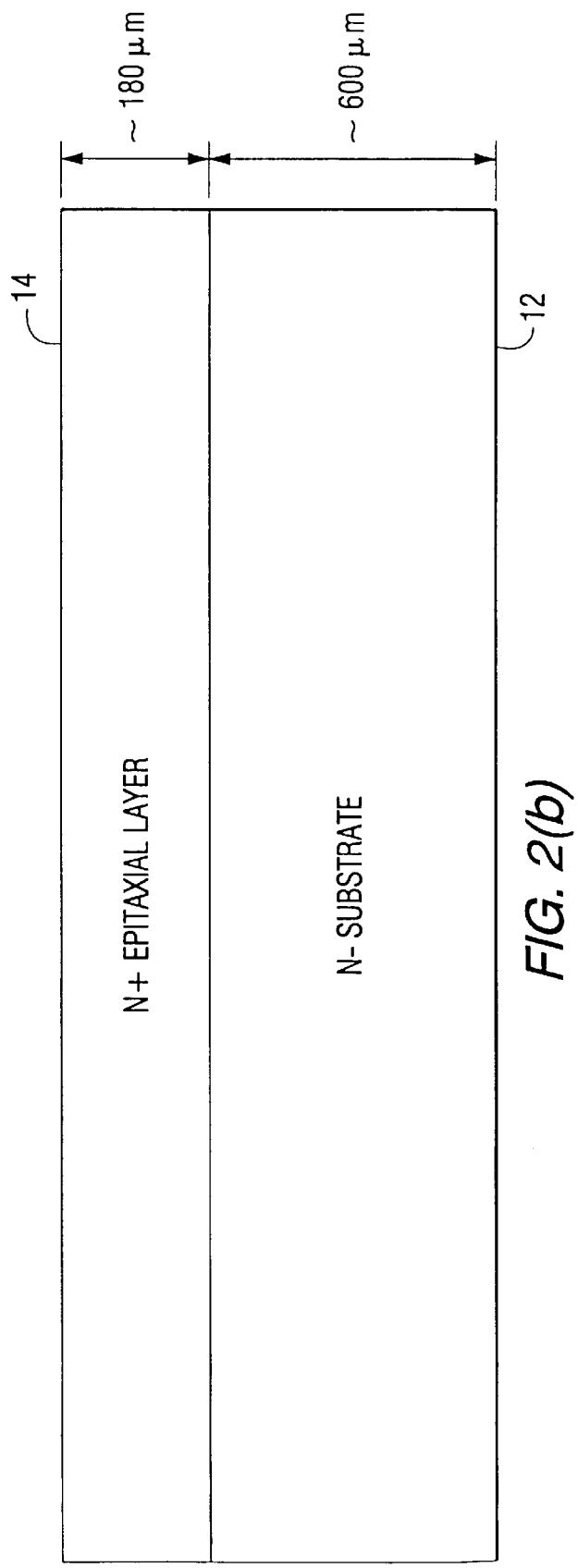

Next as shown in FIG. 2(b), an N+ epitaxial layer 14 is grown on one surface of the N– substrate 12. Techniques for growing the N+ epitaxial layer 14, such as by chemical vapor deposition, are well known to those skilled in the art and will not be described in detail here. In this particular embodiment, the N+ epitaxial layer 14 has a thickness of about 150 to 180 μm. Since the N+ eipitaxial layer 14 is not the "primary" device layer, factors such as the resistivity, uniformity of thickness, and stacking faults in the N+ epitaxial layer 14 are not critical. Since material quality factors are of a concern, the N+ epitaxial layer 14 may also be grown more rapidly instead of the normal slow growth used to minimize stacking faults. Additionally, since the N− substrate 12 is used to provide the thicker device layer, i.e. greater than about 200 μm thick, the N+ epitaxial layer 14 only needs to be grown to a thickness of about 150 to 180 μm where the previously noted problems with material quality are less likely to occur. The N+ epitaxial layer 14 is the drain for the field effect transistor 10.

Although an epitaxial layer 14 is shown, the epitaxial layer 14 could be replaced with other layers, such as a polysilicon layer. As with the epitaxial layer 14, techniques for growing the polysilicon layer are well known to those skilled in the art and will not be described in detail here Preferably, the polysilicon layer is between about 200 μm and 300 μm thick, although the thickness can vary as needed. Additionally, although an N+ epitaxial layer 14 is grown on the N− substrate 12, other combinations of layers with different conductivities, such as an N+ epitaxial layer on a P− substrate or a P+ epitaxial layer on an N− substrate could be used.

Once the N+ epitaxial layer 14 is grown, then the original N− substrate 12 is ground and polished to remove a portion of the N− substrate 12. In this particular embodiment, the N− substrate 12 is ground and polished down to a thickness of about 200 to 300 μm although the thickness can vary as needed and desired. Techniques for removing a portion of the N− substrate 12, such as by a backgrind or backlap process where one side of a wafer is ground and polished until the desired thickness for the substrate is obtained, are well known to those skilled in the art and will not be described in detail here. The remaining N− substrate 12 is then cleaned to remove any residual contaminants. The ground and polished N− substrate 12 is used as the "primary" device layer. The transistor 10 benefits from the higher material quality of the N− substrate 12 which does not have the same material quality problems that an epitaxial layer 14 of the same thickness would have.

Figure 2C:
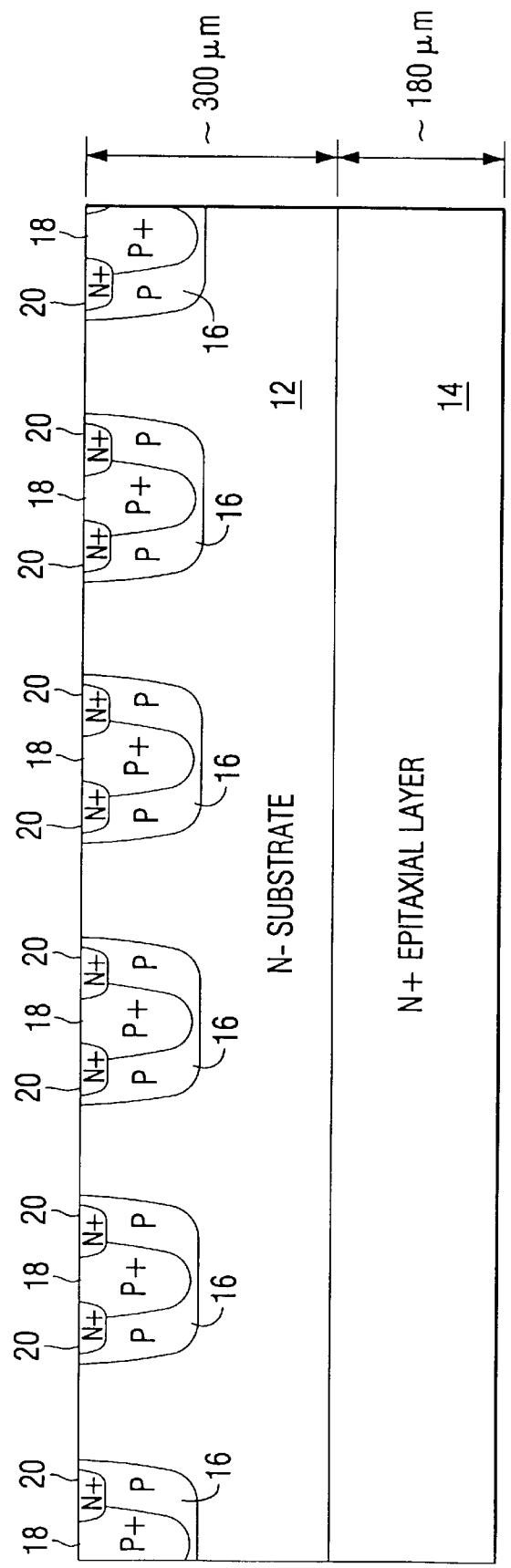

Referring to FIG. 2(c), once the portion of the N− substrate 12 is removed and cleaned, then a plurality of P regions 16 are doped in to the N− substrate 12 on the opposing surface from the N+ epitaxial layer 14 to form the source for the transistor 10. Next, a P+ region 18 is doped in each of the P regions 16 and then a pair of N+ regions 20 are doped on opposing sides of each P region 16. Techniques for masking and doping the P regions 16, P+ regions 18, and N+ regions 20 into the N− substrate 12 are well known to those skilled in the art and will not be described in detail here.

Figure 2D:
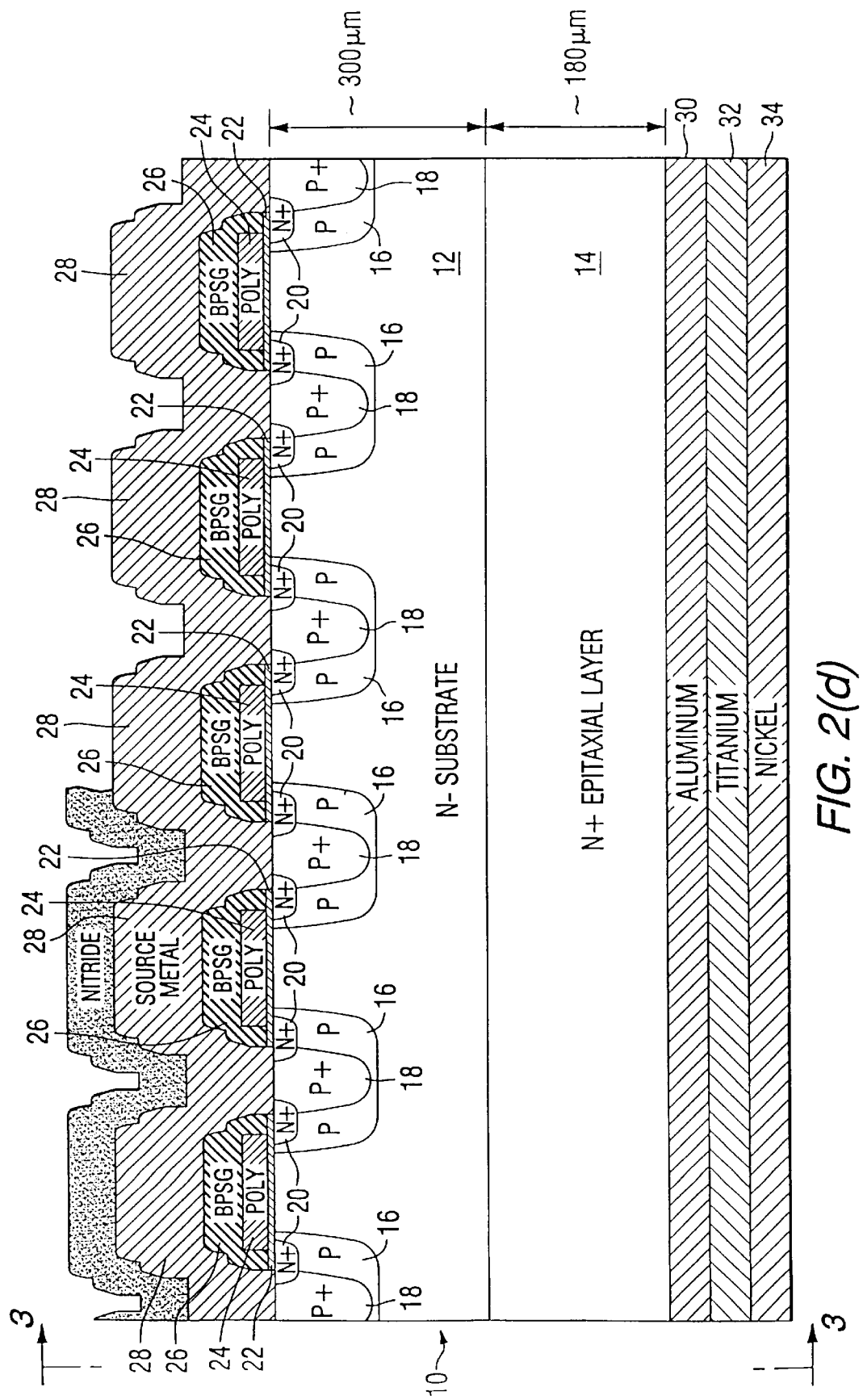
Figure 3A:
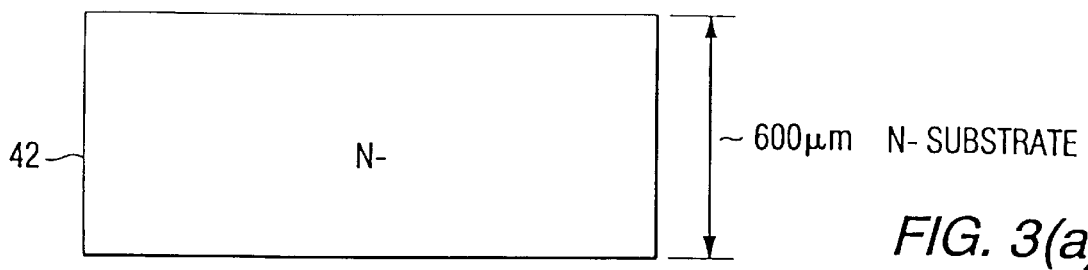
FIGS. 3(a–e) are cross-sectional views illustrating another method for fabricating a vertical power DMOS transistor in accordance with the present invention.
Figure 3B:
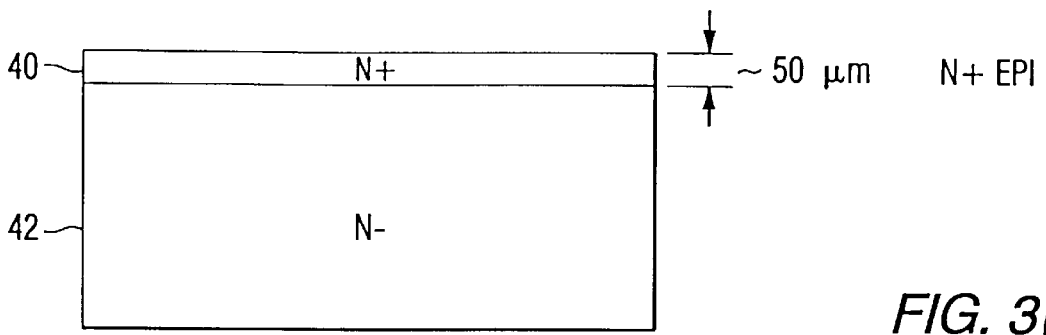
Figure 3C:
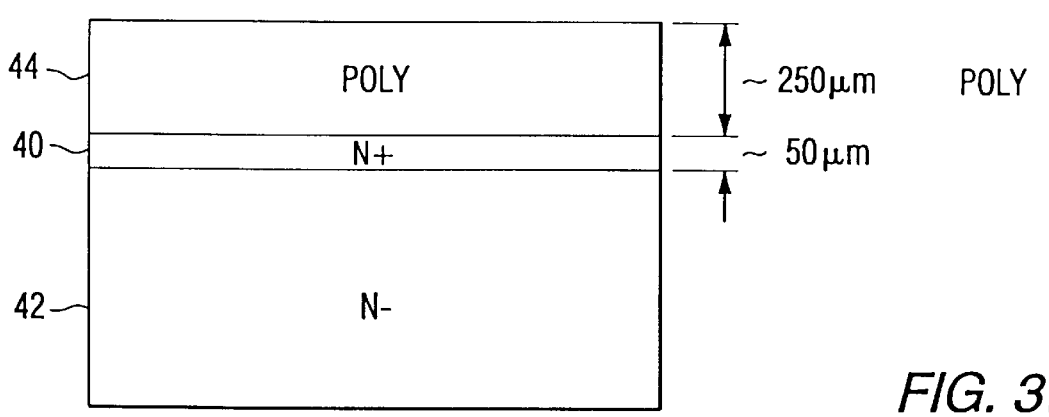
Figure 3D:
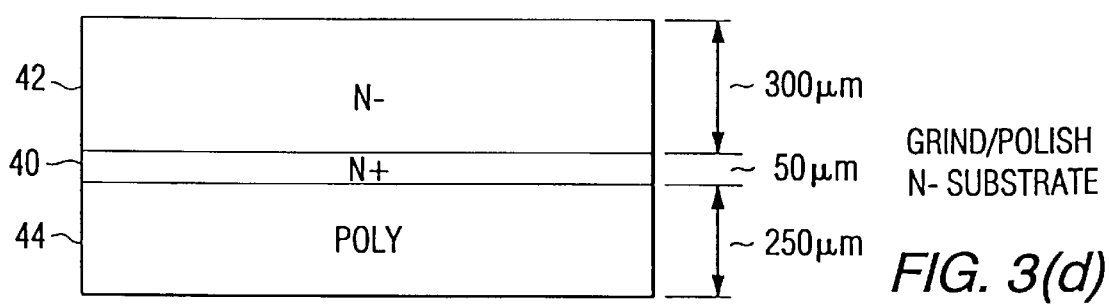
Figure 3E:
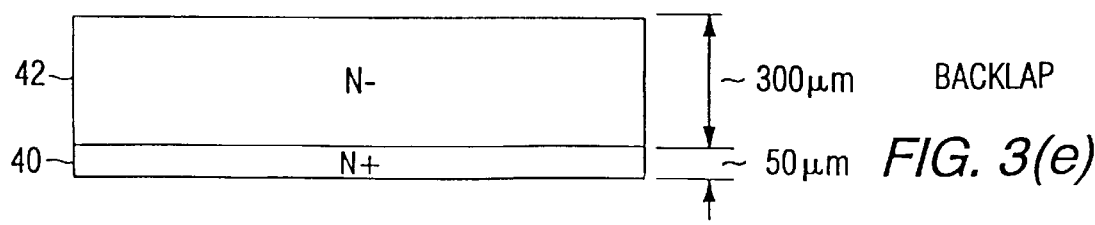

Referring to FIG. 2(d), once the plurality of N+ regions 20 are formed, then an oxide layer 22 is formed over the P− substrate 12 and the P regions 16, P+ regions 18, and N+ regions 20. Next, a gate polysilicon layer 24 is formed over the oxide layer 22. The gate polysilicon layer 24 and the oxide layer 22 are etched, using techniques well known to those skilled in the art, to expose the top of the P+ regions 18 and a portion of each of the N+ regions 20. An insultator layer 26 is formed over the gate polysilicon layer 24 by techniques, such as chemical vapor deposition. Techniques for forming the oxide layer 22, the gate polysilicon layer 24, and the insulator layer 26 are well known to those skilled in the art and thus will not be described in detail here. In this particular embodiment, the gate polysilicon layer 24 is between about 0.5 μm and 2.0 μm thick. Next, a source metal 28 is deposited over the insulator layer 26 and the exposed top portions of the P+ regions 18 and the N+ regions 20. On the opposing surface of the N+ epitaxial layer 14, an aluminum layer 30, a titanium layer 32, and a nickel layer 34 are deposited on the N+ epitaxial layer 14 using techniques well know to those skilled in the art. The aluminum, titanium, and nickel layers 30, 32, and 34 form the drain metal for the field effect transistor 10.

The resulting transistor 10 using the supporting N− substrate 12 as a device layer and illustrated in FIG. 2(d) includes: the N− substrate 12 and the N+ epitaxial layer 14 which are the drain for the transistor 10; the plurality of N+ regions 20 which are the source for the transistor 10; the plurality of P regions 16 and P+ regions 18; the oxide layer 22 on the N− substrate 12 and the P regions 16, P+ regions 18, and N+ regions 20; the gate polysilicon layer 24 on the oxide layer 22; the insulator layer 24 on the gate polysilicon layer 24; the source metal 28 on the insulator layer 24 and on the P+ regions 18 and the N+ regions 20; the aluminum, titanium, and nickel layers 30, 32, and 34 on the opposing surface of the N+ epitaxial layer 14 form the drain metal. As noted earlier, other layers, such as a polysilicon layer, could be used for the epitaxial layer 14.

Referring to FIGS. 3(a–e), an alternative embodiment for fabricating a field effect transistor is illustrated. As shown in FIGS. 3(a–b), an N+ epitaxial layer 40 is grown on an N− substrate 42. As discussed earlier, the conductivity of layers 40 and 42 can vary as needed, for example layers 40 and 42 could be an N+ epitaxial layer on a P− substrate or a P+ epitaxial layer on an N− substrate. In this particular embodiment, the N− substrate is about 600 μm thick and the N+ epitaxial layer 42 is about 50 μm thick, although the thickness can vary as needed and desired. A polysilicon layer 44 is then grown on the N+ epitaxial layer 40 as shown in FIG. 3(c). In this particular embodiment, the polysilicon layer 44 is about 250 μm thick, although the thickness can vary as needed and desired. As discussed in greater detail earlier and shown in FIG. 3(d), N− substrate 42 is ground and polished to a desired thickness, in this particular example 300 μm. Once the N− substrate 42 is ground and polished, a technique, such as a backgrind or a backlap process, is used to remove polysilicon layer 44. The advantage of this method is that a thinner epitaxial layer 40 can be formed then with the prior method. Once the polysilicon layer 44 is removed, a field effect transistor can be formed in N− substrate 42 and N+ epitaxial layer 40 as previously described with reference to FIGS. 2(c–d).

Referring back to FIG. 2(d), the resulting transistor 10 is turned on when a voltage (from a voltage source not shown) is applied to the gate polysilicon layer 24. The voltage in the gate polysilicon layer 24 generates a field in the P region 16 which permits current to flow from the N+ regions 20 which are the source for the transistor 10 through the P region 16 to N− substrate 12 and N+ epitaxial layer 14 which are the drain for the transistor 10. The P+ region 18 in each P region 16 is used to mitigate punch through from one side of the P region 16 to the other side of the P region 16. When the voltage is removed from the gate polysilicon layer 24, then transistor 10 is turned off.

Having thus described the basic concept of the invention, it will be readily apparent to those skilled in the art that the foregoing detailed disclosure is intended to be presented by way of example only, and is not limiting. Various alteration, improvements and modifications will occur and are intended to those skilled in the art, though not expressly stated herein. These modifications, alterations, and improvement are intended to be suggested hereby, and are within the spirit and scope of the invention. Accordingly, the invention is limited only by the following claims and equivalents thereto.

What is claimed:

1. A field effect transistor comprising:

a substrate of monocrystalline semiconductor material lightly doped to provide a drift region in the body of the substrate;

a heavily doped epitaxial layer of semiconductor material on one surface of the substrate for forming a surface drain region in contact with the drift region in the body of the substrate;

a plurality of highly doped source regions formed in the other surface of the substrate;

a plurality of gate regions disposed between opposite source regions, each gate region comprising an insulating layer on the surface of the substrate and a conductive gate layer on the insulating layer.

2. The field effect transistor of claim 1 wherein the substrate is thicker than the epitaxial layer.

3. The field effect transistor of claim 2 wherein the substrate is between 200 $\mu$m and 300 $\mu$m.

4. The field effect transistor of claim 1 wherein the epitaxial layer is highly doped.

5. The field effect transistor of claim 1 wherein the epitaxial layer is less than 200 $\mu$m thick and the substrate is more than 200 $\mu$m thick.

6. The field effect transistor of claim 1 wherein the gate insulating layer comprises silicon dioxide and the gate conductor comprises doped polysilicon.

7. The field effect transistor of claim 6 further comprising:

a second insulating layer disposed over both surfaces of the transistor;

a plurality of openings in the insulating layer above the sources, source metal contacts disposed in the openings above the sources and extending to the sources for electrically contacting the sources; and one or more openings in the insulating layer over the epitaxial layer;

one or more drain metal contacts disposed in the opening above the epitaxial layer for electrically contacting the drain.

* * * * *